(12) United States Patent
Kantipudi

(10) Patent No.: US 9,812,216 B1
(45) Date of Patent: Nov. 7, 2017

(54) CIRCUITS AND METHODS FOR GENERATING A CLOCK ENABLE SIGNAL USING A SHIFT REGISTER

(71) Applicant: Altera Corporation, San Jose, CA (US)

(72) Inventor: Kalyana Kantipudi, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/197,442

(22) Filed: Jun. 29, 2016

(51) Int. Cl.
*G01R 31/3173* (2006.01)
*G11C 19/00* (2006.01)
*G01R 31/317* (2006.01)

(52) U.S. Cl.
CPC .......... *G11C 19/00* (2013.01); *G01R 31/3173* (2013.01); *G01R 31/31704* (2013.01); *G01R 31/31727* (2013.01)

(58) Field of Classification Search
CPC .... G11C 19/00; G11C 19/28; G01R 31/2851; G01R 31/30; G01R 31/317; G01R 31/31704; G01R 31/31727; G01R 31/3173; G01R 31/3181

USPC ...................... 377/19, 54, 64, 70, 71, 73, 75
See application file for complete search history.

(56) References Cited

U.S. PATENT DOCUMENTS

| | | | |
|---|---|---|---|
| 4,975,640 A * | 12/1990 | Lipp | G06F 11/27 324/73.1 |
| 5,005,173 A * | 4/1991 | Martin | G01R 31/31857 714/27 |
| 8,620,638 B1 * | 12/2013 | Chan | G06F 17/5022 703/13 |
| 8,621,303 B1 | 12/2013 | Kantipudi et al. | |
| 2003/0070118 A1 * | 4/2003 | Nakao | G01R 31/31854 714/30 |

* cited by examiner

*Primary Examiner* — William Hernandez

(57) ABSTRACT

A shift register circuit generates a clock enable signal in response to a start signal and in response to a clock signal. The shift register circuit generates multiple pulses in the clock enable signal in response to a single transition in the start signal and in response to control signals having values that indicate to generate more than one pulse in the clock enable signal. A multiplexer circuit provides an output signal for testing an electronic circuit based on an input signal or based on the clock signal in response to the clock enable signal.

20 Claims, 7 Drawing Sheets

CIRCUITS AND METHODS FOR GENERATING A CLOCK ENABLE SIGNAL USING A SHIFT REGISTER

FIELD OF THE DISCLOSURE

This disclosure relates to electronic circuits, and more particularly to circuits and methods for generating a clock enable signal using a shift register.

BACKGROUND

Integrated circuits (ICs) typically have a number of Intellectual Property (IP) blocks (e.g., reusable units of logic that may be used generically in numerous applications) that perform various functions. The IP blocks collectively define the overall functionalities of the integrated circuit (IC). IP blocks are tested using a plurality of testing methods. One of the testing methods includes marginal defect testing. Marginal defect testing involves checking for failures on the circuitry that arise from variations in the resistances, capacitances, and other properties.

BRIEF SUMMARY

Embodiments described herein include circuits, methods, and systems for generating multiple clock enable pulses using a shift register circuit. It should be appreciated that the embodiments can be implemented in numerous ways. Some embodiments are described below.

According to an embodiment, a shift register circuit generates a clock enable signal in response to a start signal and in response to a clock signal. The shift register circuit generates multiple pulses in the clock enable signal in response to a single transition in the start signal and in response to control signals having values that indicate that the shift register circuit should generate more than one pulse in the clock enable signal. A multiplexer circuit provides an output signal based on an input signal or based on the clock signal in response to the clock enable signal.

Various objects, features, and advantages of the present invention will become apparent upon consideration of the following detailed description and the accompanying drawings, in which like reference designations represent like features throughout the figures.

DETAILED DESCRIPTION

Existing circuits and techniques for marginal defect testing are limited in their ability to derive multiple frequencies from a single reference clock signal. It is within this context that the embodiments described herein arise.

According to some embodiments disclosed herein, design-for-test (DFT) circuitry and methods are disclosed that enable the generation of multiple pulses of varying frequency from a clock signal. For example, when testing an IC that includes a logic circuit that operates at a slower frequency and a logic circuit that operates at a faster frequency, prior techniques were only able to test the logic circuits at a single frequency, which resulted in poor marginal defect coverage for the faster logic circuit. The transmission of data within a single IC die is an example of a faster transfer. The transmission of data from one IC die to another IC die in a stacked die package is an example of a slow transfer.

According to some embodiments disclosed herein, the DFT circuitry also enables IP block testing independently of its clock polarity requirements. The DFT circuitry also enables testing of IP blocks having a variety of sequentially traversing logic depths (e.g., IP blocks that require different minimum numbers of clock pulses for testing). The DFT circuitry provides significantly higher margin defect coverage without increasing the test time.

It should be understood that the present embodiments may be practiced without some or all of these specific details. In other instances, well-known operations have not been described in detail in order not to unnecessarily obscure the present embodiments.

Figure 1A:
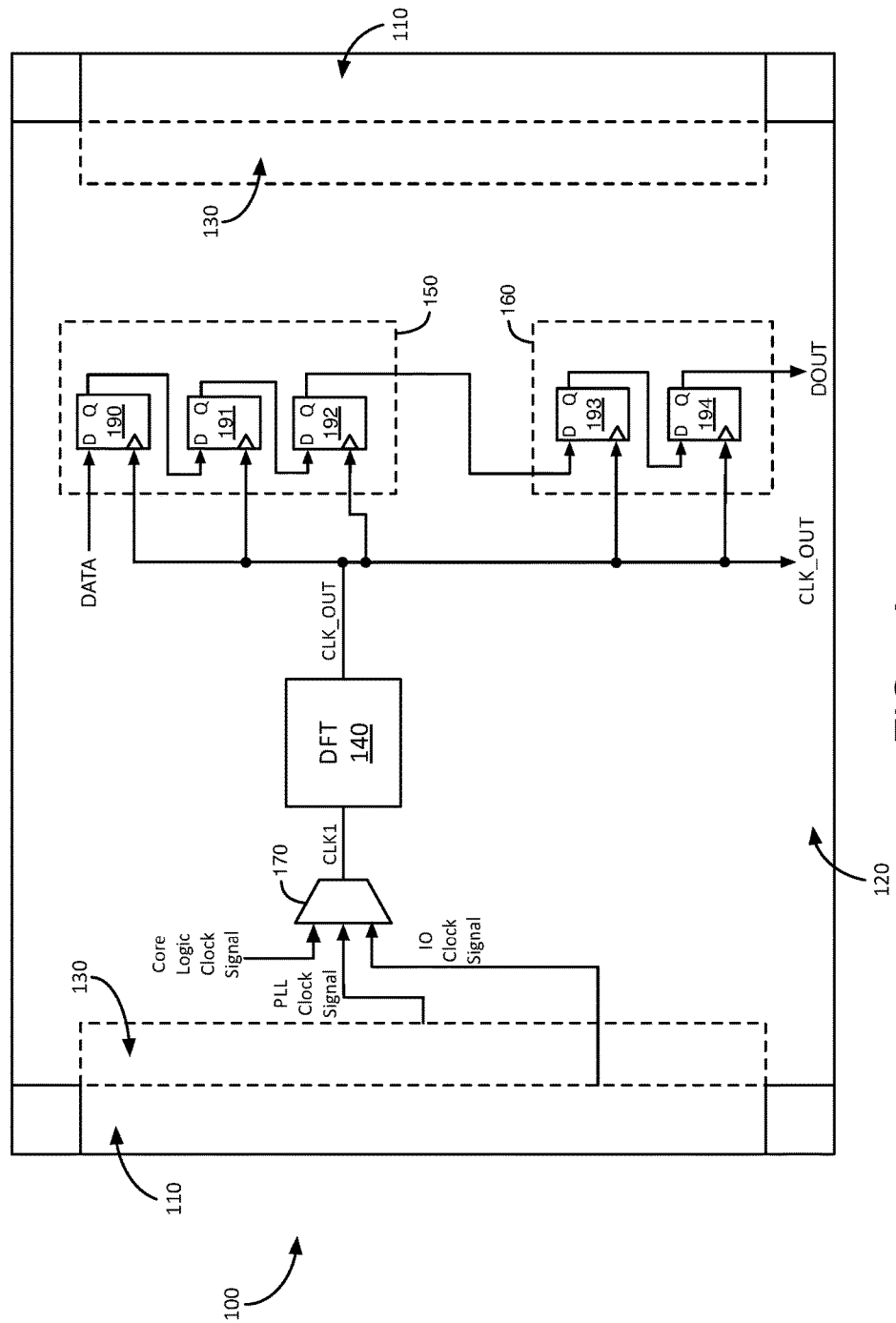
FIG. 1A, meant to be illustrative and not limiting, illustrates a single die Integrated Circuit (IC) with clock controllable Design-For-Test (DFT) circuitry in accordance with an embodiment of the present invention.

FIG. 1A, meant to be illustrative and not limiting, illustrates an Integrated Circuit (IC) 100 with clock-controllable Design-For-Test (DFT) circuitry 140 in accordance with one embodiment. IC 100 includes Input/Output (IO) circuitry 110, core logic circuitry 120, and Phase Locked Loop (PLL) circuits in region 130. The functions of IC 100 include electrical functions, e.g., storing data, executing instructions, etc. According to various embodiments, IC 100 can be a Programmable Logic Device (PLD), an Application Specific Integrated Circuit (ASIC), or an Application Specific Standard Product (ASSP). In another embodiment, IC 100 is a system on a chip (SoC) device.

IO circuitry 110 receives electrical signals from one or more external devices outside of IC 100 and transmits electrical signals to one or more external devices. The electrical signals can be substantially high speed electrical signals, e.g., signals with a frequency greater than 1 gigahertz (GHz). The functions of IO circuitry 110 include providing a communication interface to external devices.

The PLL circuits in region 130 may generate output clock signals based on input clock signals that are input into IC 100. The PLL circuits in region 130 may synchronize one or more internal clock signals with one or more external clock signals (e.g., to facilitate communication between IC 100 and external circuits). Each PLL in region 130 may be considered a clock source within IC 100. In one embodiment, the PLL circuitry in region 130 is located on the left and right peripheries of IC 100.

Core logic 120 performs core functions that may define IC 100. In one embodiment, core logic 120 performs electrical functions on input data signals. Core logic 120 may include a plurality of programmable logic elements (LEs) in one embodiment. Core logic 120 may also include a plurality of interconnection means that enable communication between circuit components within IC 100. Data signals can be received by core logic 120 through IO 110 or transmitted out of core logic 120 via IO 110.

Figure 1B:
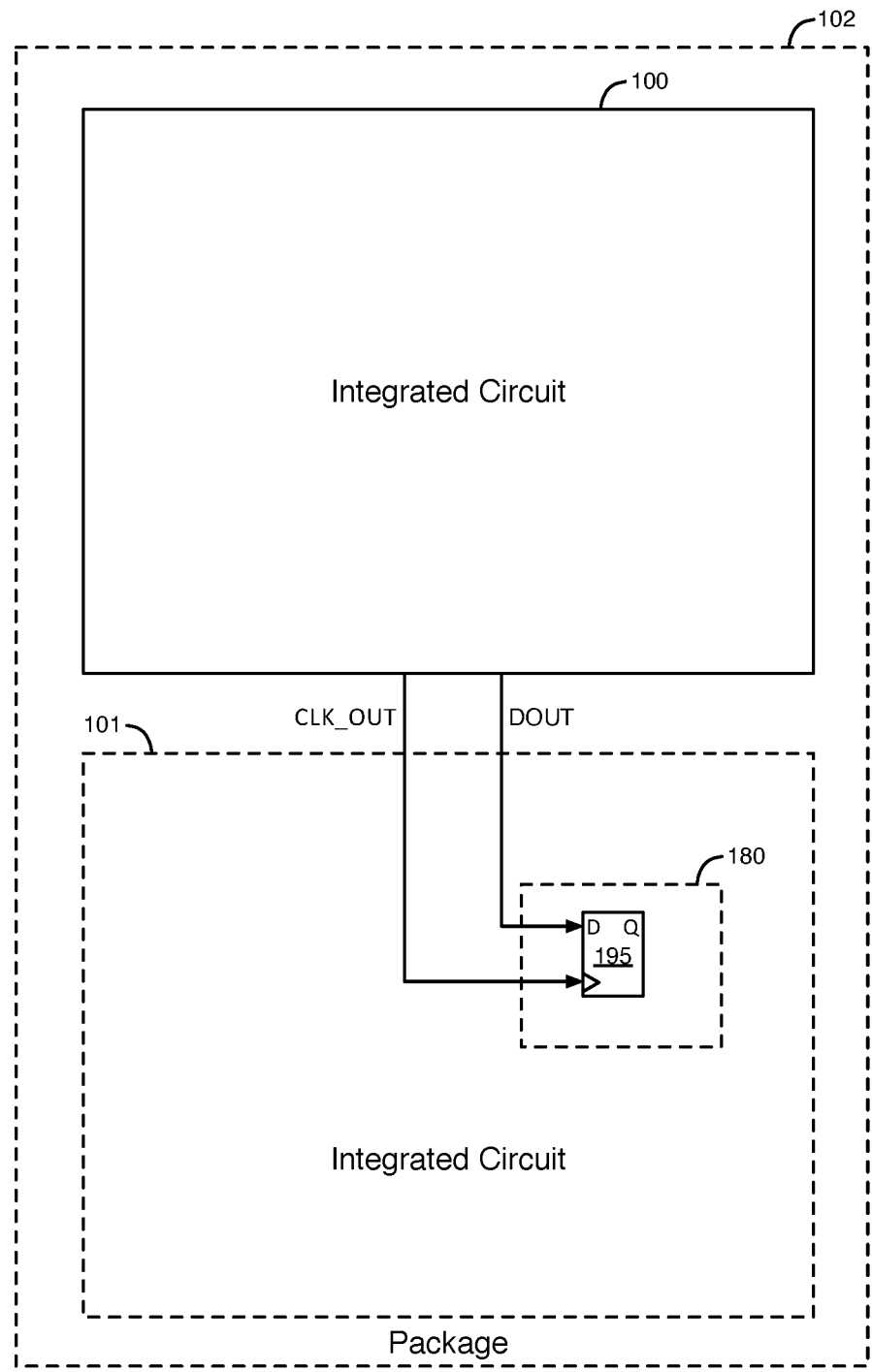
FIG. 1B, meant to be illustrative and not limiting, illustrates a stacked die package where two Integrated Circuits (ICs) are contained in a single package with clock controllable Design-For-Test (DFT) circuitry in accordance with an embodiment of the present invention.

Each input to DFT circuitry 140 can be selected through a multiplexer from any of the PLL circuitry in region 130, the IO circuitry 110, and the core logic circuitry 120. The examples in FIGS. 1A and 1B illustrate that a clock signal CLK1 is selected by multiplexer 170 from any of the PLL circuitry in region 130, the IO circuitry 110, or the core logic circuitry 120.

Core logic 120 includes DFT circuitry 140 and Intellectual Property (IP) blocks 150 and 160 as illustrative examples. IP blocks 150 and 160 may be proprietary circuitry blocks performing an electrical function. According to various embodiments, IP blocks 150 and 160 are logic array blocks (LABs), digital signal processing (DSP) blocks, processor blocks, memory control blocks, etc. IP blocks 150 and 160, together with other IP blocks (not shown), collectively perform the core functions of IC 100. In another embodiment, a collection of different circuitry, e.g., the logic array blocks, the DSP blocks, etc., may form one or more of IP blocks 150 or 160.

DFT circuitry 140 receives a clock signal CLK1 that is selected from a plurality of clock sources by multiplexer 170. Multiplexer circuit 170 may select a PLL clock signal from one of the PLL circuits in region 130, an IO clock signal from IO circuitry 110, or a core logic clock signal from core logic circuitry 120 to generate clock signal CLK1. DFT circuitry 140 generates pulses in an output clock signal CLK_OUT based on the received CLK1 signal. DFT circuitry 140 is described in further detail below with respect to FIGS. 2A-4B. The output clock signal CLK_OUT with the desired pulse count and frequency is supplied to each of the IP blocks 150 and 160. Each of IP blocks 150 and 160 may be capable of controlling whether to receive clock signal CLK_OUT by a controlling input, e.g., scan enable signal (not shown).

IP block 150 contains registers 190, 191, and 192. The connections between registers 190 and 191 and 192 are tested for marginal defects using techniques disclosed herein with respect to FIGS. 2A-4B. IP block 160 contains registers 193 and 194. Registers 190-194 are D flip-flop circuits. Clock signal CLK_OUT is provided to the clock input of each of the register circuits 190-194, as shown in FIG. 1A.

The connections between registers 193 and 194 are tested for marginal defects using techniques disclosed herein with respect to FIGS. 2A-4B. The maximum operating frequency of IP block 150 from register 190 to register 192 may be different than the maximum operating frequency of IP block 160 from register 193 to register 194. If these maximum operating frequencies are different, different frequencies may be required to implement a high coverage marginal defect test. The techniques disclosed herein with respect to FIGS. 2A-4B can generate different frequencies to optimally test both registers inside IP block 150 and registers inside IP block 160 from a single reference clock.

IP blocks 150 and 160 may vary in terms of their sequential data traversing depths. If the sequential data traversing depth of IP block 150 is different than the sequential data traversing depth of IP block 160, a different number of clock pulses are needed to cause data signals to propagate through IP block 150 compared to IP block 160 (e.g., from an input of an IP block to an output, such as a scannable output, of that IP block). An example of different sequential data traversing depths is illustrated in FIG. 1A. A data signal DATA is provided to the D input of register 190. IP block 150 requires 3 pulses of clock signal CLK_OUT to transfer the data indicated by signal DATA across 3 registers 190-192 from the input D of register 190 to output Q of register 192. IP block 160 requires 2 pulses of clock signal CLK_OUT to transfer the data received from IP block 150 across 2 registers 193-194 from the input D of register 193 to output Q of register 194 as data signal DOUT. The techniques disclosed herein with respect to FIGS. 2A-4B can generate a different number of pulses or cycles in the clock signal CLK_OUT to optimally test both IP block 150 requiring 3 clock pulses and IP block 160 requiring 2 clock pulses. Examples of IP blocks 150 and 160 that may require different clock pulses include interconnect circuitry, partially scannable circuitry, and memory interfacing circuitry. The movement of the data within each IP block can be performed at any clock triggering event, such as at the rising edge of a clock pulse (or at the falling edge of a clock pulse) of clock signal CLK_OUT.

IP block 150 or 160 may include a plurality of interconnections and gates. Marginal defect testing may be performed to verify the functioning of each of the interconnections and gates. The marginal defect testing includes transferring test data indicated by signal DATA into IP block 150 or 160, subjecting the test data to the logical processes of the IP block 150 or 160, and reading the data out from the IP blocks in signal DOUT. Each IP block 150 or 160 may require different frequencies of clock signal CLK_OUT or different numbers of pulses in clock signal CLK_OUT for operation and testing.

Figure 2A:
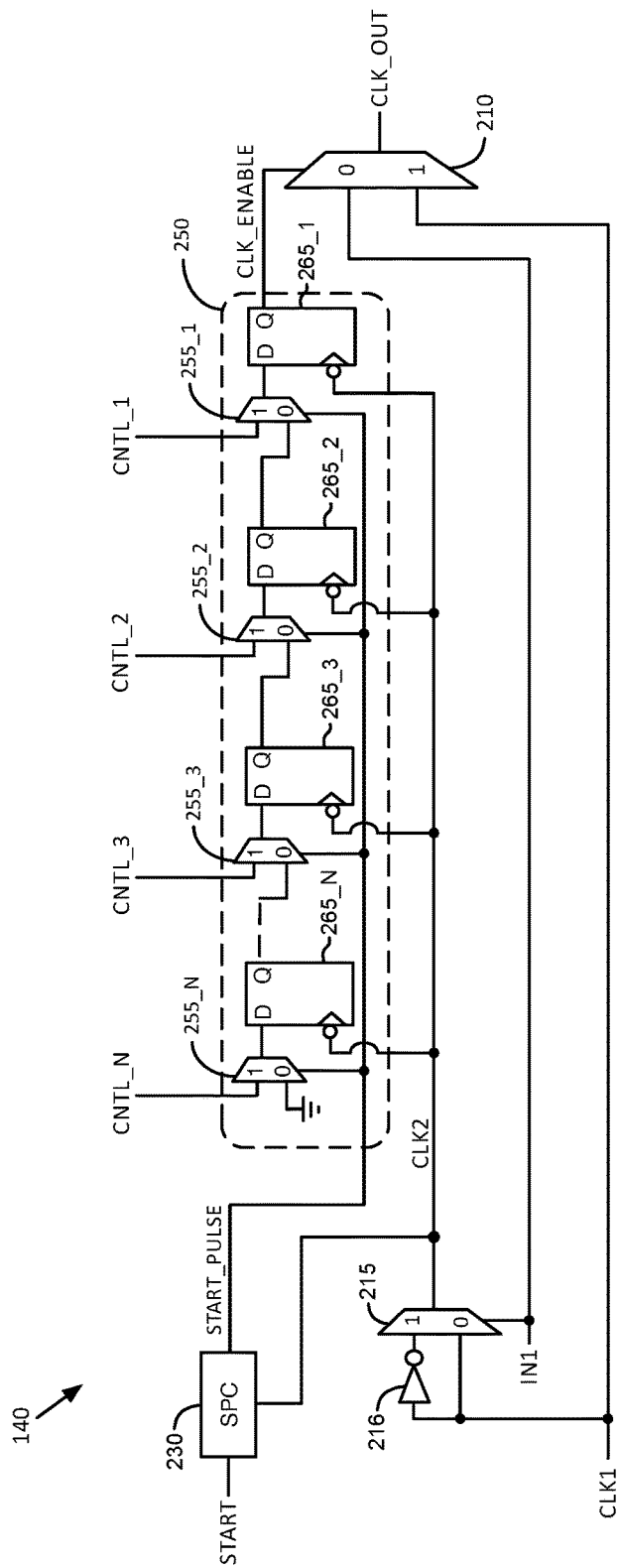
FIG. 2A, meant to be illustrative and not limiting, illustrates a detailed implementation of clock controllable DFT circuitry in accordance with an embodiment of the present invention.

FIG. 1B, meant to be illustrative and not limiting, illustrates a stacked die configuration where two Integrated Circuit (IC) die 100-101 are in the same stacked die package 102. IC 100 and IC 101 can be any integrated circuits. According to various embodiments, IC 100 and IC 101 can be any of a Programmable Logic Device (PLD), an Application Specific Integrated Circuit (ASIC) or an Application Specific Standard Product (ASSP). Integrated circuit 100 of FIG. 1B is shown in FIG. 1A. Integrated circuit 101 of FIG. 1B includes IP block 180. IP block 180 includes a register 195 (i.e., a D flip-flop). Clock signal CLK_OUT and data signal DOUT are provided from IC 100 through conductors in package 102 to the clock input and the D input, respectively, of register 195. Design-For-Test (DFT) circuitry 140 as shown in FIG. 2A can perform marginal defect testing of the interface that transmits data signal DOUT between IC 100 and IC 101 at one frequency of clock signal CLK_OUT. DFT circuitry 140 can perform marginal defect testing within IP block 160 (e.g., from register 193 to register 194) at a second frequency of clock signal CLK_OUT, as discussed below with respect to FIGS. 2A-4B.

FIG. 2A, meant to be illustrative and not limiting, is an exemplary implementation of clock controllable Design-For-Test (DFT) circuitry 140 in accordance with one embodiment. DFT circuitry 140 as shown in FIG. 2A is one example of DFT circuitry 140 as illustrated in FIG. 1A. DFT circuitry 140 may include a first multiplexer circuit 210, a second multiplexer circuit 215, a start pulse circuit (SPC)

230, and a Parallel In Serial Out Shift Register (PISOSR) circuit 250. PISOSR circuit 250 includes an N number of multiplexer circuits 255_1, 255_2 255_3, . . . 255_N (also referred to herein as multiplexers 255[N:1]) and an N number of registers 265_1, 265_2, 265_3, . . . 265_N (also referred to herein as registers 265[N:1]) that are coupled together to implement a parallel-in-serial-out shift register. DFT circuitry 140 may receive an input clock signal CLK1, a control signal START, an input signal IN1, and a set of control signals CNTL_1, CNTL_2, CNTL_3, . . . CNTL_N (also referred to herein as CNTL[N:1]). In one embodiment, the input signals START and IN1 are selected from IO circuitry 110 or core logic circuitry 120 of FIG. 1A. Signal functionality will first be described generally and then in more detail in the subsequent paragraphs. The CLK1 clock signal is the input clock to the controllable DFT circuit 140. The IN1 signal controls the polarity of the output clock signal CLK_OUT. The START signal controls when the output clock signal CLK_OUT pulses begin. The CNTL[N:1] signals control the frequency and the number of pulses generated in the clock enable signal CLK_ENABLE and the output clock signal CLK_OUT. In one embodiment, clock signal CLK1 may be received from any of an IO clock signal, a PLL clock signal, or a core logic clock signal, as discussed above.

A detailed description of FIG. 2A follows, beginning with detailed descriptions of each of the sub-blocks first multiplexer circuit 210, second multiplexer circuit 215, start pulse circuit 230, and PISOSR 250.

The first multiplexer 210 may function to select either the IN1 signal or the CLK1 signal as the output clock signal CLK_OUT. The selection of multiplexer circuit 210 is controlled by the clock enable signal CLK_ENABLE. The IN1 input propagates through multiplexer 210 when the CLK_ENABLE signal is equal to a logic 0. IN1 determines the polarity of CLK_OUT when CLK_ENABLE is equal to a logic 0. The CLK1 signal propagates through multiplexer 210 when the clock enable signal CLK_ENABLE is equal to a logic 1.

Inverter circuit 216 inverts clock signal CLK1 to generate an inverted clock signal. The second multiplexer 215 may function to select either clock signal CLK1 or the inverted clock signal generated by inverter 216 to generate clock signal CLK2 at its output. The selection of multiplexer circuit 215 is controlled by the IN1 signal. In response to IN1 being equal to a logic 0, multiplexer circuit 215 causes its output clock signal CLK2 to be logically equal to CLK1. In response to IN1 being equal to a logic 1, multiplexer circuit 215 causes clock signal CLK2 to be logically equal to the inverted clock signal output by inverter 216.

Start pulse circuit 230 generates an output signal START_PULSE. The width of a pulse in the START_PULSE signal may be equal to one clock cycle of clock signal CLK2 synchronized with CLK2 and initiated by the START input signal. Operation of the start pulse circuit 230 begins with a toggling input clock CLK2 and the START input signal being asserted from a logic 0 to a logic 1.

Figure 2B:
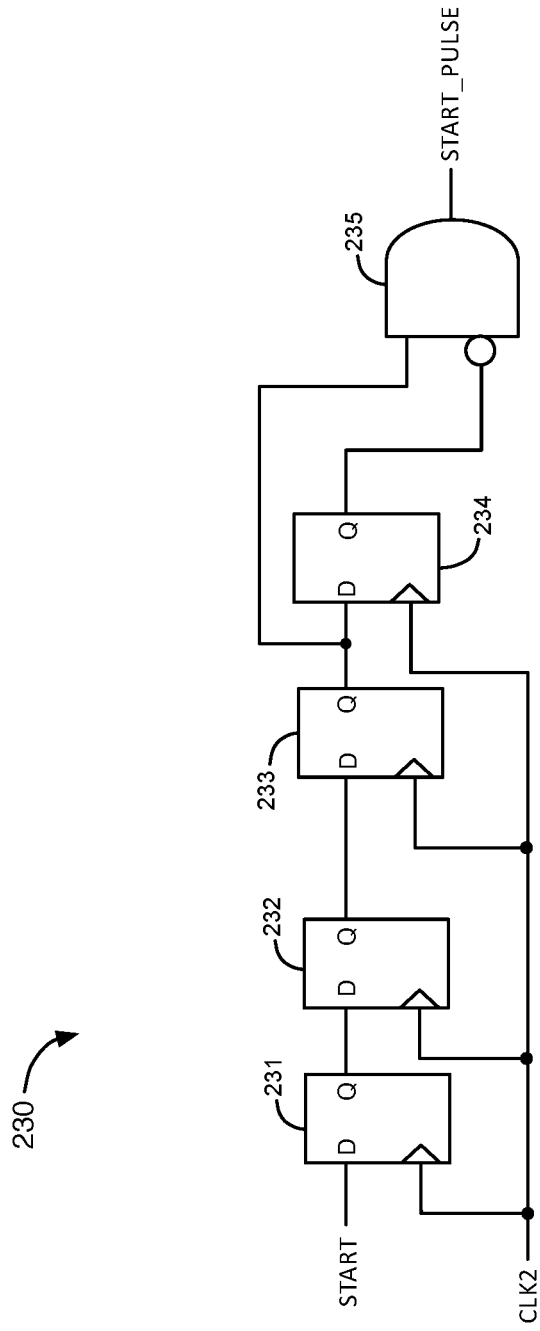
FIG. 2B illustrates further details of the start pulse circuit of FIG. 2A according to an embodiment of the present invention.

FIG. 2B illustrates further details of the start pulse circuit 230 according to an embodiment of the present invention. Start pulse circuit 230 includes register circuits 231-234 and logic AND gate circuit 235. Registers 231 and 232 synchronize the asynchronous START input signal with the CLK2 clock signal. Register 232 also reduces the probability of a metastable data transfer compared to an implementation without register 232. When the asynchronous START signal is asserted from a logic 0 to a logic 1, the logic 1 propagates from input signal START to the Q output of register 231 on the rising edge of CLK2 and then from the Q output of register 231 to the Q output of register 232 on the next rising edge of CLK2. Register 233, register 234, and AND gate 235 generate a single output pulse in signal START_PULSE of width equal to one cycle of clock signal CLK2 for each assertion from logic 0 to logic 1 of the START signal. The signal at the Q output of register 233 is provided to a non-inverting input of AND gate circuit 235. The signal at the Q output of register 234 is provided to an inverting input of AND gate circuit 235. The output signal START_PULSE of AND gate 235 is only asserted with a logic 1 when the signal at the Q output of register 233 is a logic 1 and the signal at the Q output of register 234 is a logic 0. In response to the signals at the Q outputs of registers 233-234 both being a logic 1 or both being a logic 0, the output signal START_PULSE of AND gate 235 is a logic 0.

PISOSR circuit 250 generates a clock enable CLK_ENABLE output signal in response to input signals CLK2, START_PULSE, and CNTL[N:1]. PISOSR circuit 250 can generate multiple pulses in clock enable signal CLK_ENABLE in response to CNTL[N:1] having values that indicate to generate multiple CLK_ENABLE pulses with a controllable frequency and pulse count. Operation of the PISOSR circuit 250 begins with setting the values of the control signals CNTL[N:1] to determine the desired CLK_ENABLE frequency and pulse count. PISOSR circuit 250 is responsive to clock signal CLK2 toggling.

Operation of PISOSR 250 begins with the START_PULSE input signal de-asserted with a logic 0. The START_PULSE signal is provided to the select input of each of the multiplexer circuits 255[N:1]. The control signals CNTL_1, CNTL_2, CNTL_3, . . . CNTL_N are provided to the '1' multiplexing inputs of multiplexer circuits 255_1, 255_2, 255_3, . . . 255_N, respectively. The '0' multiplexing input of multiplexer circuit 255N is coupled to a node at a ground voltage. In an alternative embodiment, the '0' multiplexing input of the first multiplexer circuit in the PISOSR may be coupled to a supply voltage VCC. The '0' multiplexing inputs of multiplexer circuits 255_1, 255_2, 255_3, . . . are coupled to the Q outputs of registers 2652, 265_3, 265_N, . . . , respectively. Clock signal CLK2 is provided to the inverting clock inputs of registers 265[N:1].

When the START_PULSE signal is equal to a logic 0, multiplexer circuits 255[N:1] provide the logic states of the signals at their '0' multiplexing inputs to their respective outputs. In response to the START_PULSE signal being a logic 0, multiplexer circuit 255_N provides a logic 0 signal to the D input of register 265_N based on the ground voltage at its 0 input. Logic Os are then sequentially shifted through all of registers 265_N through 265_1 from their D inputs to their Q outputs through multiplexers 255[N:1] in response to falling edges in clock signal CLK2 while the START_PULSE signal remains in a logic 0 state.

The next operational phase of the PISOSR circuit 250 begins with the assertion of the START_PULSE input signal from a logic 0 to a logic 1. When the START_PULSE signal is equal to a logic 1, multiplexer circuits 255[N:1] provide the logic states of the signals CNTL[N:1] at their '1' multiplexing inputs to their respective outputs at the D inputs of registers 265[N:1]. Thus, the D inputs of the N registers 265[N:1] are determined by the respective control signals CNTL[N:1]. In response to the START_PULSE signal being in a logic 1 state, the logic states of control signals CNTL[N:1] are loaded in parallel into registers 265[N:1] through multiplexers 255[N:1], respectively. Registers 265[N:1] store the logic states of control signals CNTL[N:1] at their Q outputs, respectively, in response to a falling edge of clock signal CLK2. The START_PULSE signal is asserted to a logic 1 for a single clock cycle of CLK2. After the single cycle logic 1 pulse in the START_PULSE signal, the START_PULSE signal is de-asserted to a logic 0. In response to the logic 0 in the START_PULSE signal, selection for multiplexers 255[N:1] is set equal to a logic 0 again, and registers 265[N:1] function to serially shift out the stored logic states of the control signals CNTL[N:1] at their Q outputs to the clock enable signal CLK_ENABLE at the Q output of register 265_1.

Operation of the PISOSR circuit 250 concludes after the desired pulses have been generated in the clock enable signal CLK_ENABLE. The PISOSR circuit 250 serially shifts out the stored logic states of the control signals CNTL[N:0] in response to clock signal CLK2 toggling and the START_PULSE signal being de-asserted to a logic 0. In response to the START_PULSE signal remaining in a logic 0 state, the D input of register 265_N is set by multiplexer 255_N to a logic 0, and the clock enable signal CLK_ENABLE remains driven to a logic 0. Using these techniques, PISOSR circuit 250 may generate the desired frequency and count of clock enable pulses in the clock enable signal CLK_ENABLE where the pulse frequency and count is determined by the CNTL[N:1] control signals.

In some embodiments, the non-clock input signals can be a part of Configuration Random Access Memory (CRAM) in a PLD. The control signals may also be transmitted from another memory element or register. The memory elements or registers can be programmable through electronic design automation (EDA) software.

Figure 3:
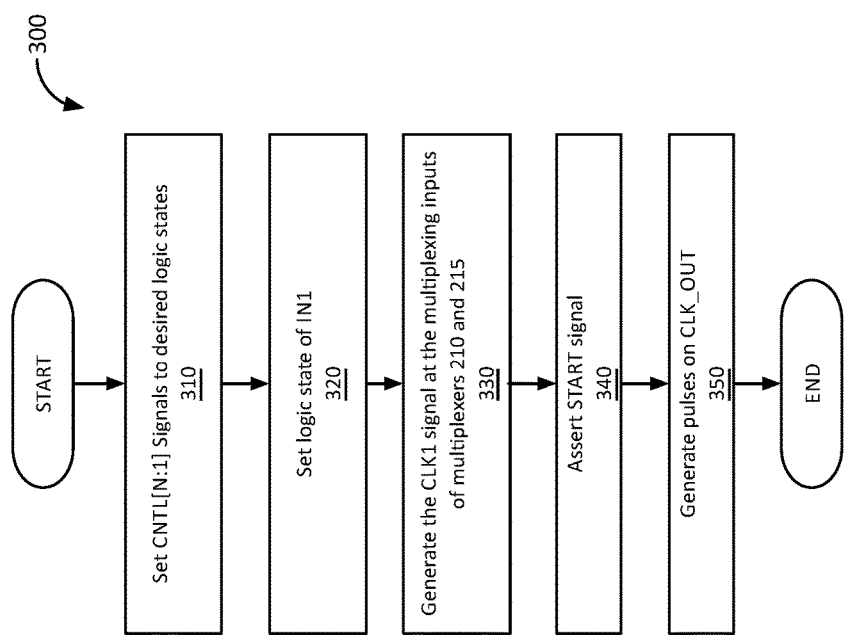
FIG. 3, meant to be illustrative and not limiting, shows illustrative operations involved in a method of utilizing DFT circuitry such as the DFT circuitry of FIG. 2A in accordance with an embodiment of the present invention.

FIG. 3, meant to be illustrative and not limiting, shows illustrative operations involved in an exemplary process to operate design-for-test (DFT) circuitry in accordance with one embodiment, such as FIG. 2A. FIG. 3 illustrates operations 300 which include a sequence of operations starting with operation 310 and ending with operation 350. Operation 310 involves setting control signals CNTL[N:1] to set a pulse frequency and a pulse count of the clock enable signal CLK_ENABLE. The pulse count may refer to the number of pulses in a sequence of pulses in the clock enable signal CLK_ENABLE. The pulse frequency may refer to the frequency of the sequence of pulses. The pulse count can be a value that is between zero and N, where N is a positive non-zero integer, e.g., 1, 2, 3, and so on. One factor in determining the value of N could be the required pulse count to obtain high test coverage of the circuit under test. A predefined pulse count may be received from interconnects coupled to IO pins, configurable memory elements, or registers within the IC. The control signals CNTL[N:1] referred to in operation 310 may be the control signals in DFT circuit 140 in FIGS. 1A, 1B, and 2A. Operation 320 involves setting the logic state of input signal IN1 to set the polarity of the CLK_OUT signal before, during, and after pulses are generated in the CLK_OUT signal. When signal IN1=logic "0," the CLK_OUT signal is a static logic "0" before and after pulse generation. When signal IN1=logic "1," the CLK_OUT signal is a static logic "1" before and after pulse generation. The IN1 signal also determines whether the PISOSR circuit 250 is clocked on the rising edge (when IN1="1") or on the falling edge (when IN1="0") of clock signal CLK1. Operation 330 involves generating the CLK1 signal at the multiplexing inputs of the multiplexers 210 and 215. Operation 340 involves asserting the START signal by driving the START signal from a logic "0" to a logic "1". The START signal may be asynchronous with the CLK1 signal. Operation 350 includes the DFT circuitry 140 generating the desired pulse count and frequency on the output clock signal CLK_OUT.

Figure 4A:
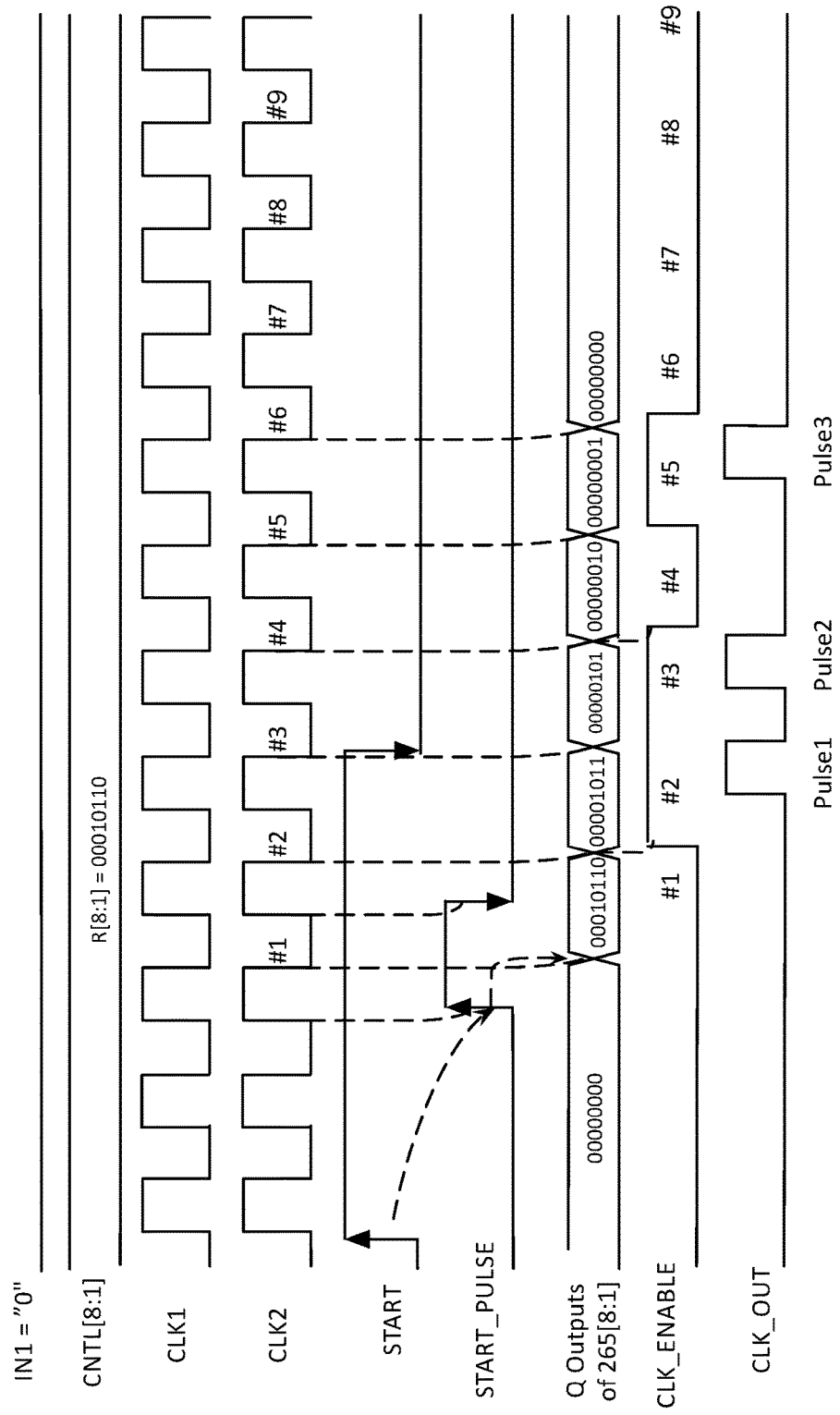
FIG. 4A, meant to be illustrative and not limiting, illustrates respective timing waveforms for the DFT circuit in FIG. 2A showing a 3-pulse, multi-frequency clock sequence in accordance with an embodiment of the present invention.
Figure 4B:
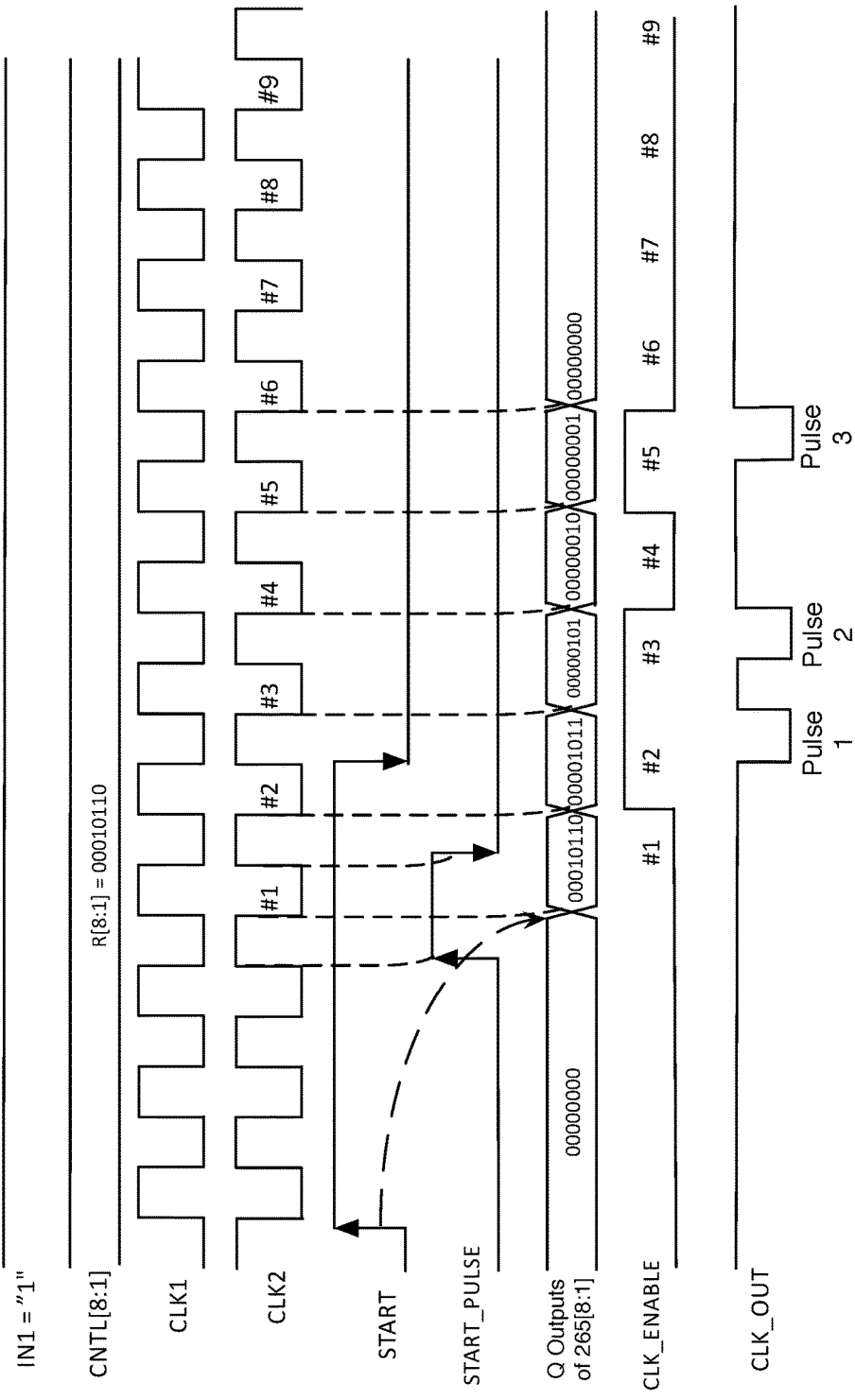
FIG. 4B, meant to be illustrative and not limiting, illustrates the functionality of an input signal through its effect on the clock output signal according to an additional embodiment of the present invention.

FIGS. 4A and 4B, meant to be illustrative and not limiting, illustrate the signal timing diagrams of the DFT circuitry 140 as shown in FIGS. 1A, 1B, and 2A for N=8 and control signals CNTL[8:1]="000101110". FIG. 4B illustrates the effect on signal CLK_OUT of setting signal IN1 to a logic "1" compared with FIG. 4A for which signal IN1 is set to a logic "0". Because in FIG. 4A signal IN1 is equal to a logic "0" and in FIG. 4B signal IN1 is equal to a logic "1", the pulses in the CLK_OUT signal in FIG. 4B are logic low pulses and the pulses in FIG. 4A are logic high pulses. Other circuit permutations such as N not equal to 8 are not explicitly illustrated but are within the scope of the invention. FIGS. 4A and 4B demonstrate two embodiments of the signal logic and timing for the DFT circuitry of FIG. 2A to generate multiple frequencies and multiple pulses in the clock enable signal CLK_ENABLE.

In FIG. 4A, the CLK_OUT signal has a pulse count of three (shown as pulses 1-3 in FIG. 4A) where the frequency of CLK_OUT from pulse 1 to pulse 2 is equal to the frequency of clock signal CLK1 and where the frequency of CLK_OUT from pulse 2 to pulse 3 is equal to half of the frequency of CLK1. In some embodiments, there may be minor delays between each respective signal shown in FIGS. 2A and 2B if compared to the signal timing diagrams illustrated in FIGS. 4A and 4B.

An embodiment of the operation of DFT circuitry 140 as illustrated with signal waveforms in FIGS. 4A and 4B is further described. Signal waveforms and circuit operation are described for the following cases: before CLK_OUT pulse generation, during CLK_OUT pulse generation, and after CLK_OUT pulse generation.

This paragraph describes operation of DFT circuitry 140 before CLK_OUT pulse generation. Waveforms before CLK_OUT pulse generation are illustrated in the left most time interval of FIGS. 4A and 4B before the rising edge of the START input signal. Referencing the time sequence of FIG. 3, steps 310, 320, and 330 have been completed and step 340 is not yet executed. Multiplexer 210 receives two input signals, the IN1 signal and the CLK1 signal. Initially, the outputs of registers 265[8:1] within PISOSR 250 have logic "0" data on their outputs. The last register 265_1, drives the CLK_ENABLE signal to a logic "0". CLK_ENABLE="0" selects the zero input of multiplexer 210 such that the CLK_OUT waveform follows the IN1 waveform. For both FIGS. 4A and 4B, the CLK_OUT waveform follows the IN1 waveform prior to the assertion of the START input signal.

This paragraph describes operation of DFT circuitry 140 during CLK_OUT pulse generation starting with the rising edge of the START input signal. FIGS. 4A and 4B illustrate 9 exemplary falling edges in the CLK2 signal that are numbered #1-#9 in these figures. In FIG. 4A, CLK2 is logically equal to CLK1 while in FIG. 4B, CLK2 is logically inverted from CLK1 where the logic state of IN1 determines whether CLK2 is inverted. Waveforms during CLK_OUT pulse generation are illustrated in FIGS. 4A and 4B beginning with the assertion of the START input signal to a logic "1" and ending before CLK2 falling edge #9. In the sequence of FIG. 3, the CLK_OUT pulse generation interval starts with step 340 and ends with the completion of step 350. As described in FIG. 2B and as illustrated in the START and START_PULSE waveforms in FIGS. 4A and 4B, the Start Pulse Circuit 230 generates an output pulse START_PULSE of width equal to one CLK2 cycle in response to the START input signal being asserted to a logic "1". With the assertion of the START_PULSE signal to a logic "1", the data from the CNTL[8:1] input signals loaded in parallel into the 8 registers 265[8:1] on the falling edge of CLK2 as shown in FIGS. 4A and 4B. This falling CLK2 edge during which registers 265[8:1] are loaded in parallel with the contents of signals CNTL[8:1] is labeled as falling edge #1 in FIGS. 4A & 4B. Subsequently, during CLK2 clock edges #2 through #8 with the START_PULSE input signal driven to a logic "0", the registers 265[8:1] function as a serial out scan chain, the last register of which, register 265[1], drives the CLK_ENABLE signal. In the examples of FIGS. 4A and 4B, the waveforms for registers 265[8:1] change from 00000000 to 00010110 after a parallel load on the falling CLK2 edge #1 where the data inputs for registers 265[8:1] are driven by the CNTL[8:1] inputs. Starting with CLK2 edge #2, the data out from registers 265[8:2] is serially scanned out. Hence, the CLK_ENABLE waveform illustrates the serial scan out of 00010110 starting with the least significant bit on CLK2 edges #1 through #8. The CLK_ENABLE signal selects which multiplexer 210 input, IN1 or CLK1, drives the multiplexer 210 output, CLK_OUT. FIGS. 4A and 4B illustrate how the CLK_OUT waveform logically follows input IN1 for CLK_ENABLE=0 and logically follows CLK1 for CLK_ENABLE=1. Each CLK1 cycle that occurs when CLK_ENABLE=1 results in a single pulse on the CLK_OUT signal. In the examples of FIGS. 4A and 4B, the waveforms illustrate that the CLK_OUT signal is equal to CLK1 for CLK_ENABLE=1 and equal to IN1 for CLK_ENABLE=0. Hence for CNTL[8:1]=00010110, the CLK_OUT waveform is shown to have 3 pulses. The period from pulse 1 of waveform CLK_OUT to pulse 2 of waveform CLK_OUT is equal to one CLK1 cycle. The period from pulse 2 of waveform CLK_OUT to pulse 3 of waveform CLK_OUT is equal to two CLK1 cycles. In summary, the CLK_OUT waveform signal in FIG. 4A has a static value of logic zero and a pulse count of three where the frequency from pulse 1 to pulse 2 is equal to the CLK1 frequency and where the frequency from pulse 2 to pulse 3 is equal to half of the CLK1 frequency.

This paragraph describes operation of DFT circuitry 140 after CLK_OUT pulse generation. Waveforms after CLK_OUT pulse generation are illustrated in FIGS. 4A and 4B starting with CLK2 falling edge #9. In the sequence of FIG. 3, the after-pulse generation interval begins with the completion of step 350. All 8 registers 265[8:1] within PISOSR 250 have logic "0" data on their Q outputs as is shown in the waveform where the register 265[8:1] outputs=00000000. By design, registers 265[8:1] are guaranteed to generate 00000000 at their Q outputs for all cycles after CLK2 falling edge #9 until such time as the START signal is re-asserted with non-zero data on signals CNTL[8:1]. The last register, 265_1, is shown to drive the CLK_ENABLE waveform to a logic "0" after CLK2 falling edge #9. CLK_ENABLE="0" selects the zero input of multiplexer 210 to cause the CLK_OUT waveform to follow the IN1 waveform after CLK2 falling edge #9. This is illustrated in FIG. 4A where for input waveform IN1="0", the CLK_OUT waveform is logically determined by IN1="0" after CLK2 falling edge #9. In FIGS. 4A and 4B, CLK_OUT is completely independent of any of signals CNTL[8:1] for all cycles after and including CLK2 cycle #9 until such time as the START signal is reasserted.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable array logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by INTEL Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing description of the exemplary embodiments of the present invention has been presented for illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A method comprising:
    generating multiple pulses in a clock enable signal using a shift register circuit in response to a single transition in a start signal and in response to control signals; and
    generating an output signal for testing an electronic circuit using a first multiplexer circuit by selecting from an input signal and a first clock signal, wherein selection of the first multiplexer circuit is controlled by the multiple pulses in the clock enable signal.

2. The method of claim 1, wherein the output signal is selectable to either generate logic high or logic low pulses.

3. The method of claim 1, wherein generating multiple pulses in the clock enable signal using the shift register circuit further comprises generating the multiple pulses in the clock enable signal in response to the control signals having values that indicate to generate more than one pulse in the clock enable signal.

4. The method of claim 1, wherein the method is a design-for-test method to screen for manufacturing defects in an integrated circuit.

5. The method of claim 1, wherein the method is a design-for-test method to bin devices for performance.

6. The method of claim 1, further comprising:
generating a single transition in a start pulse signal with a burst start circuit in response to a second clock signal and in response to the start signal.

7. The method of claim 3, wherein generating multiple pulses in the clock enable signal using the shift register circuit further comprises generating the multiple pulses in the clock enable signal in response to a second clock signal that is generated by a second multiplexer circuit using the first clock signal.

8. The method of claim 1, wherein the method is implemented in a multi-chip module.

9. A circuit comprising:
a parallel-in-serial-out shift register (PISOSR) circuit to load values in parallel from control signals and to serially shift the values out of the PISOSR circuit to generate a clock enable signal in response to a first clock signal and in response to a start signal being asserted, wherein the PISOSR circuit comprises a register and a first multiplexer circuit that is coupled to receive one of the control signals at a first input and a supply voltage or a ground voltage at a second input; and
a second multiplexer circuit to provide an output signal based on an input signal or based on the first clock signal in response to the clock enable signal.

10. The circuit of claim 9, wherein the first multiplexer circuit provides a constant logic state to the register based on the voltage at the second input in response to the start signal being de-asserted.

11. The circuit of claim 9 further comprising:
a start pulse circuit to synchronize the start signal to the first clock signal and to generate a pulse in a start pulse signal in response to the start signal.

12. The circuit of claim 9 further comprising:
a third multiplexer circuit to generate a second clock signal based on the first clock signal or based on an inverted form of the first clock signal, wherein the PISOSR circuit generates the clock enable signal in response to the second clock signal.

13. The circuit of claim 9, wherein the circuit is a design-for-test circuit to screen devices for manufacturing defects.

14. The circuit of claim 9, wherein the circuit is a design-for-test circuit to bin devices for performance.

15. The circuit of claim 9, wherein the circuit is implemented in a multi-chip module.

16. The circuit of claim 9, wherein the control signals are determined by memory elements.

17. A circuit comprising:
a shift register circuit to generate a clock enable signal in response to a start signal, wherein the shift register circuit generates multiple pulses in the clock enable signal in response to a single transition in the start signal and in response to control signals; and
a first multiplexer circuit to provide an output signal for testing an electronic circuit based on an input signal and based on a first clock signal in response to the clock enable signal.

18. The circuit of claim 17, wherein the shift register circuit varies a frequency of the clock enable signal from a first non-zero frequency to a second non-zero frequency in response to the single transition in the start signal and in response to the control signals having values that indicate to generate more than one frequency in the clock enable signal.

19. The circuit of claim 17, further comprising:
a start circuit to generate a single transition in a start pulse signal in response to a second clock signal and in response to the start signal.

20. The circuit of claim 17, wherein the shift register circuit is a parallel-in-serial-out shift register (PISOSR) circuit that loads values in parallel from the control signals and serially shifts the values out of the PISOSR circuit to generate the clock enable signal, wherein the PISOSR circuit comprises a register and a second multiplexer circuit that is coupled to receive one of the control signals at a first input and a supply voltage or a ground voltage at a second input, and wherein the second multiplexer circuit provides a constant logic state to the register based on the voltage at the second input in response to the start signal being de-asserted.

* * * * *